United States Patent
Maenishi

(10) Patent No.: US 7,739,077 B2
(45) Date of Patent: Jun. 15, 2010

(54) MOUNTING CONDITION DETERMINATION METHOD

(75) Inventor: Yasuhiro Maenishi, Saga (JP)

(73) Assignee: Panasonic Corporation, Osaka (JP)

( * ) Notice: Subject to any disclaimer, the term of this patent is extended or adjusted under 35 U.S.C. 154(b) by 309 days.

(21) Appl. No.: 11/914,273

(22) PCT Filed: Jun. 26, 2006

(86) PCT No.: PCT/JP2006/313169
§ 371 (c)(1),
(2), (4) Date: Nov. 13, 2007

(87) PCT Pub. No.: WO2007/001062
PCT Pub. Date: Jan. 4, 2007

(65) Prior Publication Data
US 2009/0082998 A1    Mar. 26, 2009

(30) Foreign Application Priority Data
Jun. 27, 2005  (JP) ............................... 2005-187392

(51) Int. Cl.
*G06F 15/00*  (2006.01)
(52) U.S. Cl. ............... 702/182; 700/32; 700/114; 700/228; 700/117; 228/9; 228/102; 228/180.21; 228/180.22; 29/890.142; 29/740; 29/832
(58) Field of Classification Search ........... 702/182; 700/32, 114, 228, 117; 228/9, 102, 180.21, 228/180.22; 29/890.142, 833, 740, 832, 29/739, 743
See application file for complete search history.

(56) References Cited

U.S. PATENT DOCUMENTS

| | | | |
|---|---|---|---|
| 4,731,923 A * | 3/1988 | Yagi et al. | 29/833 |
| 5,667,129 A * | 9/1997 | Morita et al. | 228/102 |
| 6,161,277 A * | 12/2000 | Asai et al. | 29/740 |
| 6,286,202 B1 * | 9/2001 | Asai et al. | 29/740 |
| 6,378,198 B1 * | 4/2002 | Asai et al. | 29/825 |
| 6,507,997 B2 * | 1/2003 | Kawai et al. | 29/833 |
| 6,538,425 B1 * | 3/2003 | Kawada | 324/158.1 |
| 6,643,921 B2 * | 11/2003 | Asai et al. | 29/833 |
| 6,739,036 B2 * | 5/2004 | Koike et al. | 29/743 |

(Continued)

FOREIGN PATENT DOCUMENTS

EP      0 456 218      11/1991

(Continued)

OTHER PUBLICATIONS

International Search Report issued Sep. 28, 2006 in the International (PCT) Application of which the present application is the U.S. National Stage.

(Continued)

*Primary Examiner*—Carol S Tsai
(74) *Attorney, Agent, or Firm*—Wenderoth, Lind & Ponack, L.L.P.

(57) ABSTRACT

A method determines a mounting condition of a mounter mounting a component onto a board, which includes the steps of: obtaining an operational sate parameter; and determining, in the case where a value of the obtained operational state parameter is not within a predetermined range, a mounting condition so that the value of the operational state parameter falls within the predetermined range.

2 Claims, 14 Drawing Sheets

U.S. PATENT DOCUMENTS

| | | | |
|---|---|---|---|
| 6,971,161 B1* | 12/2005 | Maenishi et al. | 29/832 |
| 6,986,196 B2* | 1/2006 | Terui | 29/740 |
| 6,996,440 B2 | 2/2006 | Maenishi et al. | |
| 7,043,824 B2* | 5/2006 | Suhara et al. | 29/740 |
| 7,185,422 B2* | 3/2007 | Sakai et al. | 29/832 |
| 7,296,727 B2* | 11/2007 | Onobori et al. | 228/180.22 |
| 7,313,860 B2* | 1/2008 | Takahashi et al. | 29/740 |
| 2002/0029468 A1* | 3/2002 | Koike et al. | 29/832 |
| 2002/0167801 A1* | 11/2002 | Suhara et al. | 361/728 |
| 2003/0051344 A1* | 3/2003 | Terui | 29/890.142 |
| 2004/0154161 A1 | 8/2004 | Aoyama et al. | |
| 2005/0060883 A1* | 3/2005 | Sakai et al. | 29/833 |
| 2005/0098610 A1* | 5/2005 | Onobori et al. | 228/180.21 |
| 2008/0250636 A1* | 10/2008 | Okuda et al. | 29/834 |
| 2009/0044401 A1* | 2/2009 | Maenishi | 29/740 |
| 2009/0204251 A1* | 8/2009 | Maenishi | 700/117 |

FOREIGN PATENT DOCUMENTS

| | | |
|---|---|---|
| EP | 0 727 933 | 8/1996 |
| EP | 1 137 335 | 9/2001 |
| EP | 1 248 509 | 10/2002 |
| EP | 1 545 181 | 6/2005 |
| JP | 2002-050900 | 2/2002 |

OTHER PUBLICATIONS

Written Opinion of the International Searching Authority issued Sep. 28, 2006 in PCT/JP2006/313169 of which the present application is the U.S. National Stage.

International Preliminary Report on Patentability issued Oct. 15, 2007 in PCT/JP2006/313169 of which the present application is the U.S. National Stage.

"Reply" filed by Applicants in PCT/JP2006/313169 of which the present application is the U.S. National Stage.

* cited by examiner (a) (b) (c)

Prior Art

FIG. 8

| Process No. | Reference rest time (msec) | Permissible highest acceleration | Speed pattern |
|---|---|---|---|
| P0001 | 40 | 1 | 1 |
| P0002 | 40 | 2 | 2 |
| P0003 | 20 | 5 | 2 |
| ⋮ | ⋮ | ⋮ | ⋮ |

FIG. 9

| Feeder No. | Rest time (msec) | Speed |
|---|---|---|
| P0001 | 40 | 1 |
| P0002 | 40 | 2 |
| P0003 | 20 | 2 |
| ⋮ | ⋮ | ⋮ |

MOUNTING CONDITION DETERMINATION METHOD

BACKGROUND OF THE INVENTION

1. Technical Field

The present invention relates to a method of determining mounting conditions of a mounter which mounts components onto a board, and in particular, to a method of determining mounting conditions which are adaptive to an individual mounter.

2. Background Art

Conventionally, both hardware and software solutions are provided in order to achieve higher throughput in a mounter which produces a component-mounted board by mounting electronic components onto a print wiring board or the like. The hardware solution aims at moving the components at a high speed in each of the following processes: a suction process of sucking and holding the components to be supplied to the board so as to pick up the components by vacuum; a transportation process of transporting the picked-up components from a component supply unit to the board; and a mounting process of lowering the transported components so as to place the components. The software solution aims to optimize mounting conditions such as an order of arranging component feeders for component supply which are equipped to the mounter, and an order of mounting the components (see reference to Japanese Laid-Open Patent Application No. 2002-50900).

In terms of hardware, tolerance of size is required in the manufacturing of the mounters, and variations in device accuracy among the individual mounters are generated due to varied manufacturing accuracies of the mounters even though the variations are within the range of the tolerance. Moreover, piece-to-piece variations in accuracy which are unique to an individual mounter such as a variation due to deterioration with age like wearing of the components making up a mounter and a variation due to change in temperature during the period from when the power is turned on until when the machine is warmed up.

Therefore, in terms of software, the mounting conditions which absorb the variations regarding hardware and guarantee a steady performance are set.

More precisely, (a) in FIG. 1 shows an ideal positional relationship between an electronic component A to be supplied and a suction nozzle 11 for sucking and holding the electronic component A. However, since there being diverse variations in the manufacturing of the mounters as mentioned above, the electronic component A may, in some cases, be supplied, misaligned with the ideal position as shown in (b) and (c) in FIG. 1. When the suction nozzle 11 attempts to suck and hold the supplied electronic component A and such misalignment occurs in the supply of the electronic component, the edge of the suction nozzle 11 is misaligned with the edge of the electronic component A.

Even in the conventional case where the edge of the suction nozzle 11 is misaligned with the edge of the electronic component A and the air leaks, as in the state shown in (b) in FIG. 1, it is still possible to directly transport the electronic component A and mount the electronic component A onto the board given that the static state is maintained for a certain period of time after the suction nozzle 11 come into contact with the electronic component A. Therefore, the variations with regard to hardware are absorbed by the software solution of setting mounting conditions which always include a static state lasting a certain period of time.

Thus, although many of the variations with regard to hardware are absorbed by the setting of the mounting conditions they are the factors that prevent the enhancement of the throughput of the mounter.

Note that the reason why the transportation and the mounting can be realized under the condition in which the static state is maintained despite of the leakage of the air is that the oscillation occurs due to the pressure within the suction nozzle 11 and the electronic component A to be sucked and held flutters immediately after the leakage, but when the static state is maintained for a certain period of time, it is possible to obtain the suction indicating a predetermined value or greater where the oscillation due to the pressure is settled down and its stability is restored. In the state as shown in (c) in FIG. 1, it is not possible to solve the problem by the software solution since the suction rate indicating a predetermined value or greater cannot be obtained even though the static state is maintained.

The present invention is conceived in view of the above-mentioned problem, and an object of the present invention is to provide the most suitable mounting conditions according to the state of an individual mounter in terms of hardware.

SUMMARY OF THE INVENTION

In order to achieve the above-mentioned object, the present invention is a mounting condition determination method for determining a mounting condition of a mounter which mounts a component onto a board. The method includes: obtaining an operational state parameter indicating an operational state of the mounter; and determining a mounting condition so that a value of the obtained parameter falls within a predetermined range.

In the obtainment of the operational state parameter, the following may be obtained as the operational state parameter: a suction accuracy which is based on an amount of misalignment between a component sucked and held by a suction nozzle and the suction nozzle; a suction rate which is obtained based on the number of components to be sucked and held by a suction nozzle, and the number of components which the suction nozzle has failed to suck and hold; a mounting accuracy which is obtained based on an amount of misalignment between the board and a component mounted on the board; a mounting rate which is obtained based on the number of components to be mounted by the mounter and the number of components which the mounter has failed to mount; a supply accuracy which is obtained based on an amount of misalignment between a position of a component to be supplied and a predetermined suction position; and one of a change over time, a temperature change and a variation among the mounters.

In the determination of the mounting conditions, the mounting condition may be determined by adjusting a rest time during which a mounting head equipped in the mounter stops after having moved, or by adjusting a rest time during which a suction nozzle stops after having descended, so that the value of the operational state parameter falls within the predetermined range. Particularly, in the case where the operational state parameter is better than the predetermined range, the mounting condition may be determined by decreasing the rest time so that the value of the operational state parameter falls within the predetermined range. In the case where the operational state parameter is worse than the predetermined range, the mounting condition may be determined by increasing the rest time so that the value of the operational state parameter falls within the predetermined range.

Also, in the determination of the mounting condition, the mounting condition may be determined by adjusting an acceleration generated when a mounting head moves, or by adjusting a speed at which a component is supplied by a component supply unit which supplies a component to the mounter, so that the value of the operational state parameter falls within the predetermined range.

Thus, it becomes possible to determine the mounting conditions based on an operational state parameter indicating the operational state of the mounter, in the case where the parameter is not within a predetermined range. This therefore enables the mounter applying the mounting condition determination method to obtain the mounting conditions which are flexibly determined depending on the error possessed by an individual mounter. In particular, in the case where the operational state parameter is greater than a predetermined range, it is also possible to obtain the mounting conditions which improve the throughput of the mounter.

In the obtainment of the operational state parameter, it is desirable that the operational state parameter is obtained and the mounting condition is determined while the mounter produces a component-mounted board.

Thus, it is possible to sequentially obtain the mounting conditions which are flexibly determined depending on the state of mounter which varies from time to time in the sequence of the operations for fabricating a component-mounted board.

Note that the object of the present invention can be achieved not only as such mounting condition determination method, but also as the mounting condition determination apparatus equipped with the units for realizing the steps included in the mounting condition determination method, and even as a program causing a computer to execute the steps, and the same effects can be obtained therewith.

Also, the same object can be achieved and the same effects can be obtained even in the case where the mounter is equipped with such mounting condition determination apparatus.

It is possible to flexibly determine the mounting conditions depending on the operational state of the mounter. Particularly, even in the case where the operational state might get worse due to the deterioration with age seen in hardware components such as the component feeders and the suction nozzles of the mounter, it is possible to prevent such deterioration by changing the mounting conditions. Moreover, in the case where the operational state of the mounter is good, it is possible to change the mounting conditions so that the throughput of the mounter can be enhanced, by reducing more or less the margin of the conditions within the normal range.

For further information about technical background to this application, the disclosure of Japanese Patent Application No. 2005-187392 filed on Jun. 27, 2005 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings:

FIG. 8 shows an example of process data;

FIG. 9 shows an example of feeder data;

DETAILED DESCRIPTION OF THE INVENTION

The following describes the embodiment of the present invention with reference to the diagrams.

Figure 1:
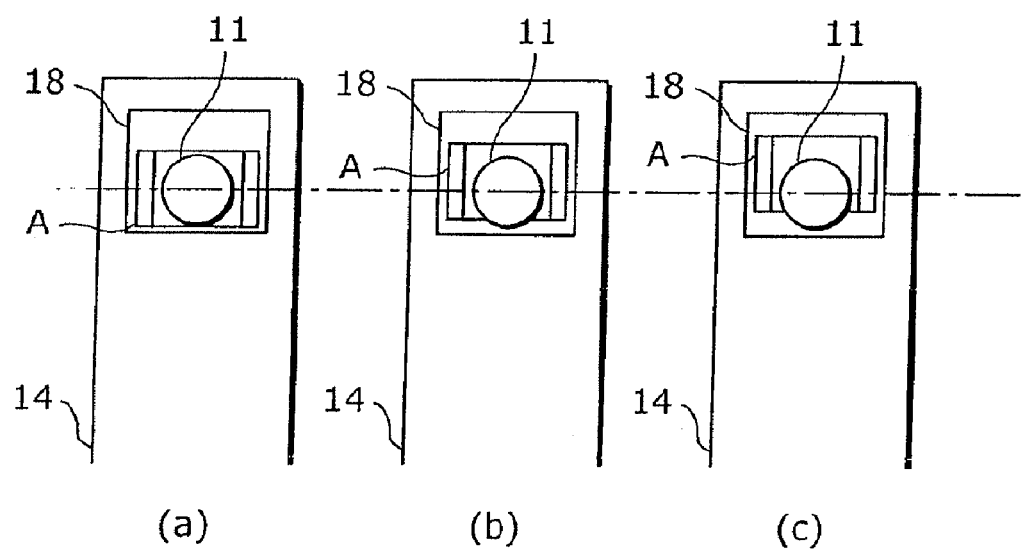
FIG. 1 is a plain view showing examples of misalignment in the component supply performed by a conventional component supply unit.
Figure 2:
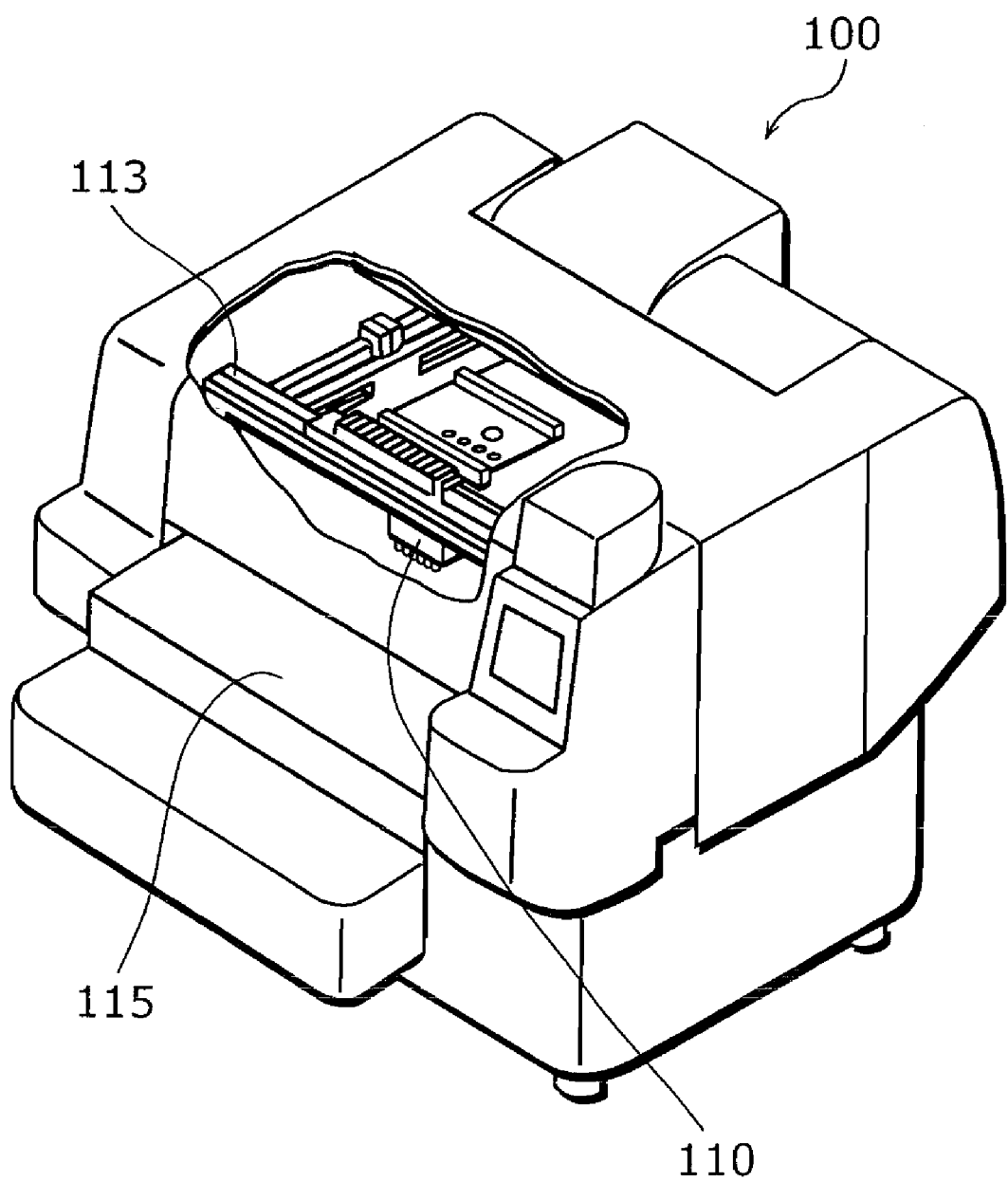
FIG. 2 is a diagonal view showing an appearance of a mounter according to the present invention, including a cut-away view showing its internal part.

FIG. 2 is a diagonal view showing an appearance of a mounter 100 according to the present invention, including a cutaway view showing its internal part.

The mounter 100 shown in the diagram can be incorporated into a mounting line, and is an apparatus which mounts electronic components onto a board received from the upper stream of the mounting line, and sends out, to the lower stream, the board on which the electronic components have already been mounted. Such mounter 100 is equipped with suction nozzles which hold the electronic components by means of vacuuming suction, and includes a multi-headed part 110 equipped with mounting heads which transports the sucked and held components onto the board, an XY robot unit 113 which moves the multi-headed part 110 in a horizontal direction, and a component supply unit 115 which supplies the mounting heads with the components.

More precisely, the mounter 100 is a mounter which can mount, on a board, various electronic components including tiny components and connectors, and is a high-speed multi-functional mounter which can mount odd-shape components such as large electronic components of 10 mm×10 mm and switch/connectors, and IC components such as Quad Flat Package (QFP) and Ball Grid Array (BGA).

Figure 3:
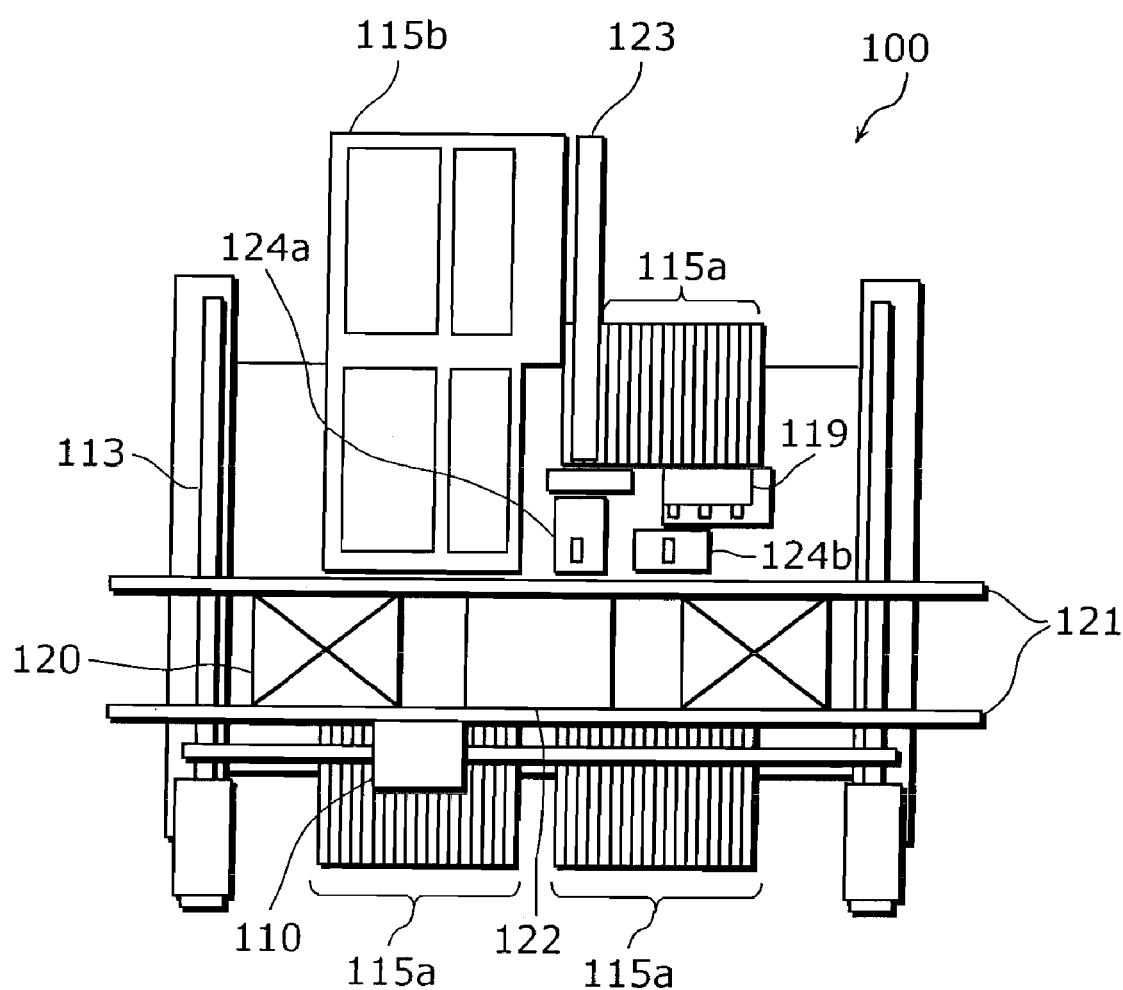
FIG. 3 is a plain view showing a main internal structure of the mounter.

FIG. 3 is a plain view showing the main internal structure of the mounter 100.

The mounter 100 further includes: a nozzle station 119 in which suction nozzles for exchange which are to be attached to a mounting head 112 (see FIG. 4) are stored to be adaptive to various types and forms of components; a rail 121 forming a path for transporting a board 120; a mounting table 122 on which the board 120 is placed for mounting the electronic components onto the transported board 120; a component collecting apparatus 123 which collects the components in the case where the electronic components sucked and held by the multi-headed part 110 are defective; and a recognition apparatus 124 which recognizes the state of the electronic components held by the multi-headed part 110 through image analysis.

The recognition apparatus 124 shoots the electronic components sucked and held by the suction nozzles of the multi-headed part 110, and obtains misalignment of each electronic component with respect to the suction nozzle in X, Y and θ directions, based on the position of the suction nozzle and the shot image of the electronic component. The mounter 100 according to the embodiment is equipped with a recognition apparatus 124a based on a CCD camera scheme, which shoots an electronic component with a CCD camera and obtains an image of a sucked and held electronic component, and a recognition apparatus 124b based on a line sensor scheme, which irradiates laser beam onto an electronic component and obtains an image of the electronic component through a reflected beam. It is possible to select one of the recognition apparatuses 124a and 124b depending on the type of the component. The image is processed regardless of the scheme used to take the image, and the recognition apparatus 124 provides the amount of misalignment obtained in the holding of the electronic component.

The component supply unit 115, which is set in the front and at the back of the mounter 100, includes a component supply unit 115a made up of component feeders for supplying the electronic components placed in a tape, and a component supply unit 115b which supplies the electronic components placed in a plate with partitions applied according to the size of the components.

Figure 4:
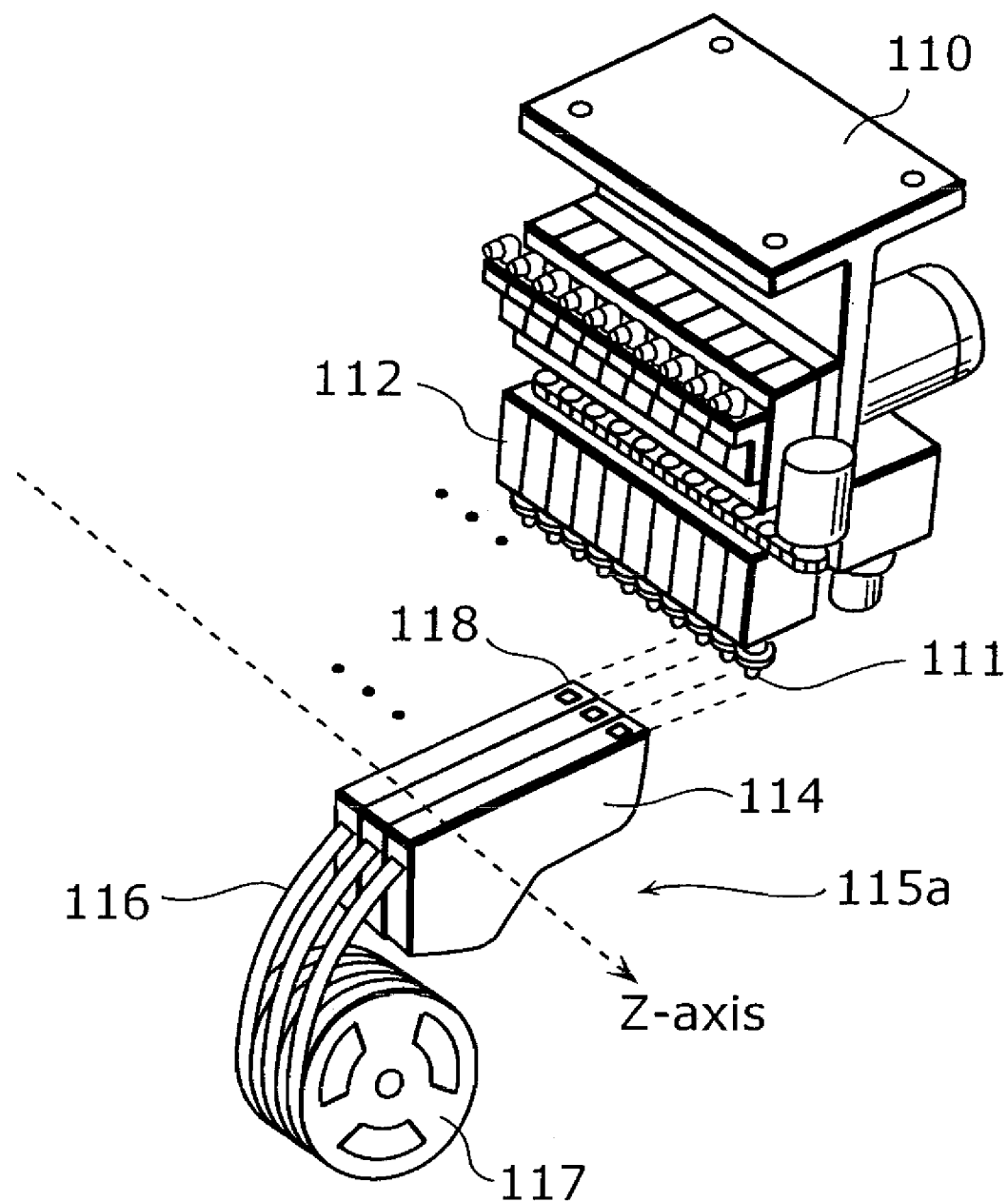
FIG. 4 is a diagonal view showing a positional relationship between a multi-headed part and a supply unit.

FIG. 4 is a diagonal view showing a positional relationship between the multi-headed part 110 and the supply unit 115a made up of the component feeders.

As shown in the diagram, the multi-headed part 110 is equipped with plural mounting heads 112, on the edge of which the suction nozzles 111 can be freely exchanged.

The component feeders composing the component supply unit 115a as shown in the diagram is composed of: a component tape 116 for storing the electronic components which are arranged onto a carrier tape; a supply reel 117 which holds the component tape that is wound up; and a tape feeder 114 which sends out the component tape 116 from the supply reel 117 as required, takes out an electronic component from the component tape 116, and allows the electronic component to be exposed on a feed pocket 118.

In the case of the present embodiment, the component supply unit 115a holds the component feeders which are arranged in Z-axis direction, and has a structure that allows exchange of the component feeders as required such as component shortage as well as exchange between the component tape 116 and the supply reel 117.

Figure 5:
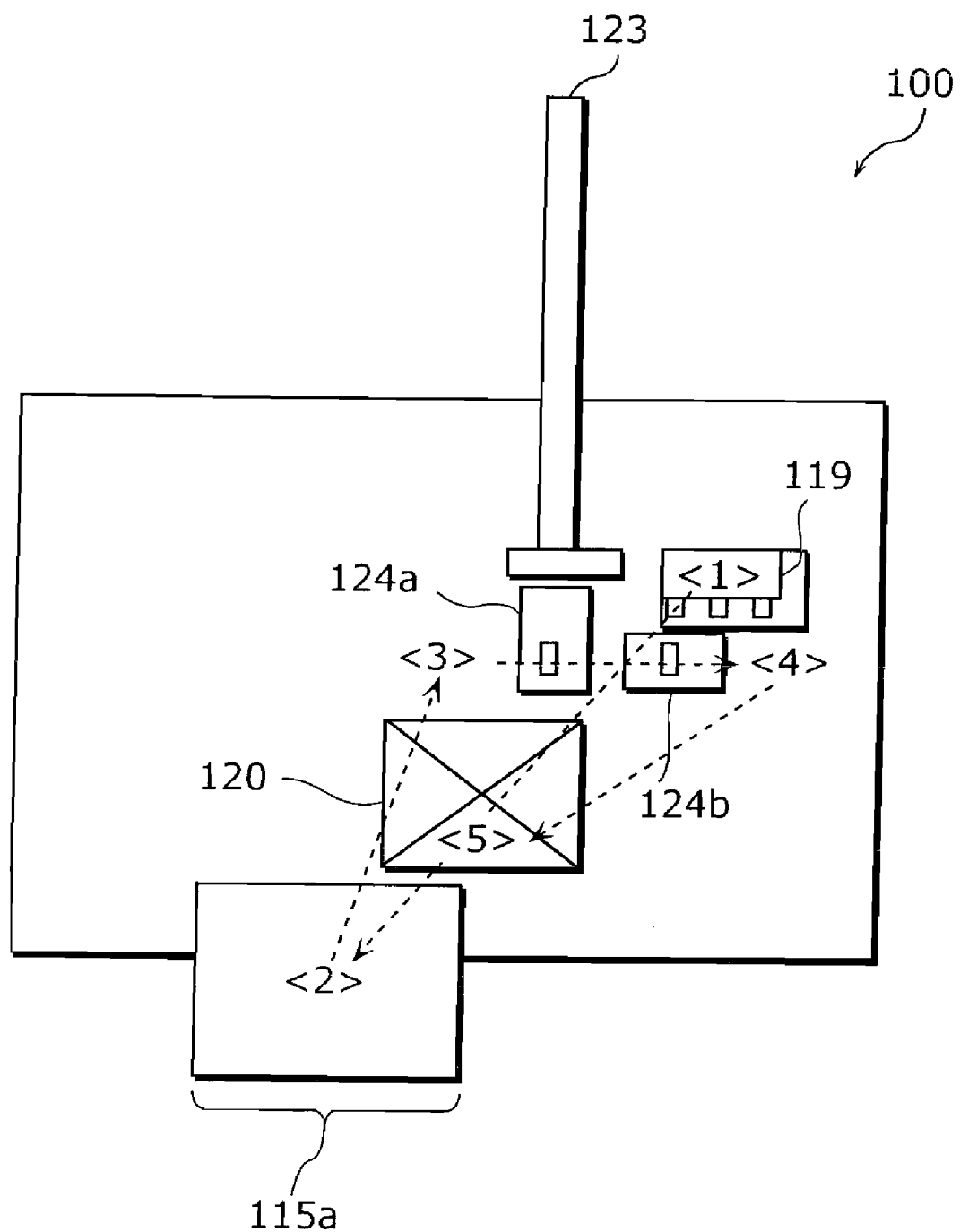
FIG. 5 is a plain view showing a trace of the multi-headed part which moves within the mounter.

Next, the mounter 100 generally mounts the electronic components onto the board 120 as in the procedure <1> to <5> in FIG. 5 indicated below.

Figure 6:
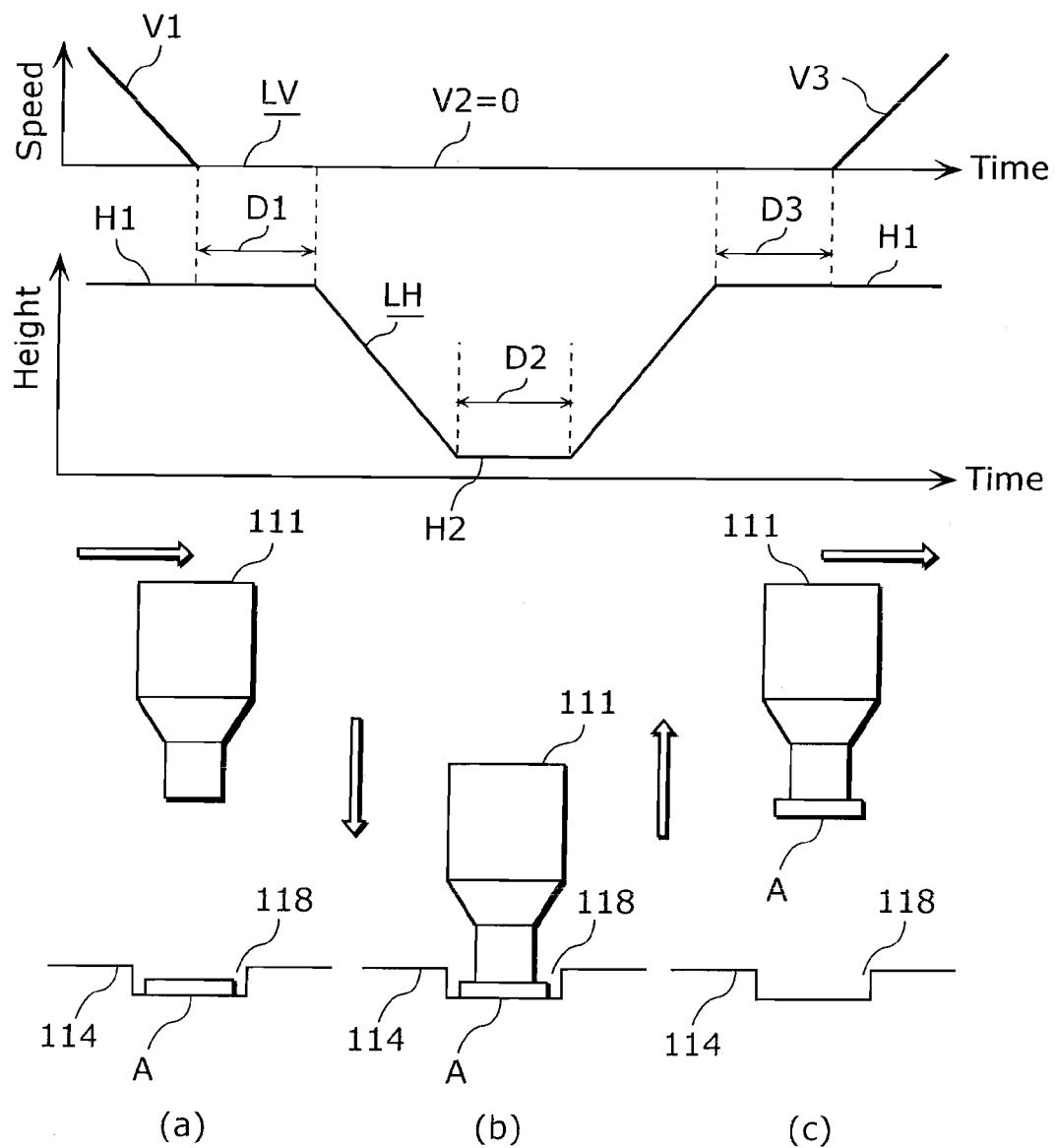
FIG. 6 shows the movement made when a suction nozzle sucks and holds an electronic component, the line in the upper graph shows a speed at which the multi-headed part moves in a horizontal direction while the line in the lower chart shows the height of the suction nozzle.

FIG. 6 is a plain view showing a trace of the multi-headed part 110 which moves within the mounter 100.

As shown in the diagram, in the case where an electronic component A to be mounted does not match with the suction nozzle 111 equipped to the multi-headed part 110, the mounter 100 operates as shown in the following procedure <1> through <5> (<1> in FIG. 5, and the same applies to <2> to <5> indicated below):

<1> Move the multi-headed part 110 to the nozzle station 119, and exchange the suction nozzle 111 to the one that matches with the electronic component A.

<2> Move the multi-headed part 110 to the position above the component feeder 115a.

<3> Move the multi-headed part 110 near the recognition apparatus 124.

<4> Pass the multi-headed part 110 above the recognition apparatus 124.

<5> Move the multi-headed part 110 to the position above the board 120, and then mount the electronic component A by fitting the component into the suction nozzle 111.

In order to mount the electronic components A necessary for one board, the procedure <1> through <5> is repeated and each process is operated based on the mounting conditions including a condition regarding positive or negative acceleration and a rest time after the operation stops.

The movement of the suction nozzle 111 will be described in detail.

FIG. 6 shows the movement made when the suction nozzle 111 sucks and holds an electronic component A, where a line LV indicates the speed at which the suction nozzle 111 (of the multi-headed part 110) moves in a horizontal direction, while a line LH indicates the height of the suction nozzle 111. These lines LV and LH compose a timing chart. The charts (a) to (c) placed below the timing chart show the movement of the suction nozzle 111.

The multi-headed part 110 decreases the speed in a steady manner within the horizontal plane (V1 in the timing chart) as the time elapses and stops at a predetermined position above the component supply unit 115. Namely, the speed becomes 0. Since the stopping operation is sudden, the multi-headed part 110 oscillates even after the stop. The amplitude and the damping time of the oscillation varies depending on the mounter, but a time during which the mounter stops until the oscillation fades away is set as a mounting condition (D1). That is to say that a time lag is set for the period from when the speed becomes 0 until when the suction nozzle 111 starts descending. After the predetermined time (D1) has passed, the suction nozzle 111 starts descending in order to suck and hold the electronic component A supplied by the component supply unit 115. It is set, as a mounting condition, that the suction nozzle 111 stops for a while in the lowest point (H2) of the stroke of the suction nozzle 111, that is, the position (hereinafter to be referred to as "bottom dead center") where the electronic component A comes into contact with the suction nozzle 111 (D2). The suction nozzle 111 stops at the bottom dead center in order to wait for the fluttering of the electronic component A, which is caused at the initial contact, to fade away so that a stable suction can be obtained, even in the case where a leakage of air occurs due to the misalignment between the electronic component A and the suction nozzle 111. After that, the suction nozzle 111 sucks and holds the electronic component A, and then rises. It is set, as a mounting condition, that the suction nozzle 111 stops for a while after reaching the highest point (H1) (hereinafter to be referred to as "top dead center") (D3). After a certain time (D3) elapses, the multi-headed part 110 starts moving together with the suction nozzle 111 sucking and holding the electronic component A within the horizontal plane at a constant acceleration (V3).

Note that in some cases, the time for settling the oscillation (D1, D2 and D3) may be 0. In other words, there is a case in which the operation proceeds to another without stopping.

The state in which the suction nozzle 111 moves for mounting the electronic component A is almost the same as the abovementioned case.

Figure 7:
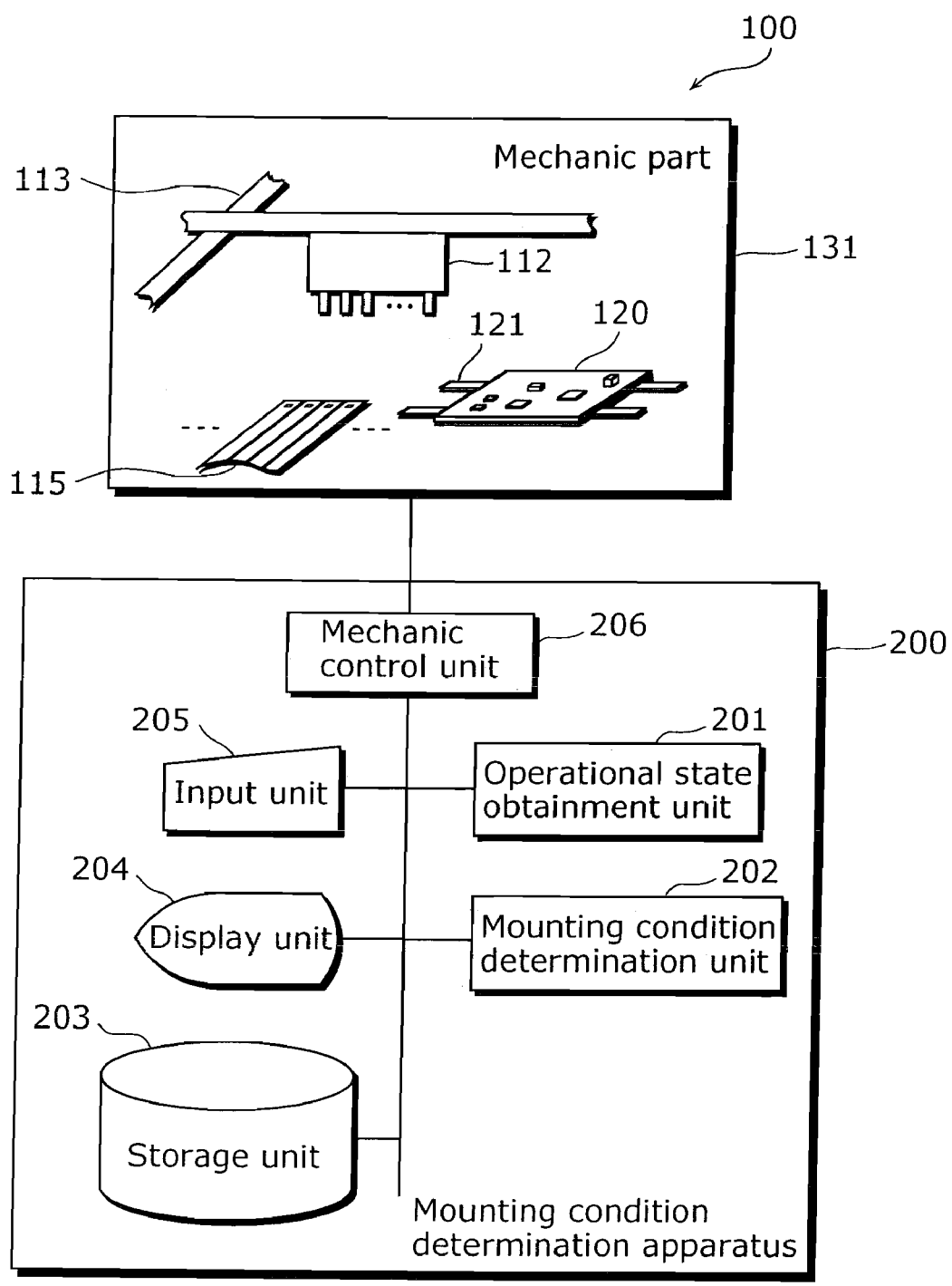
FIG. 7 is a block diagram showing a functional configuration of a mounter 100 equipped with a mounting condition determination apparatus.

FIG. 7 is a block diagram showing each component of the mounter 100.

As shown in the diagram, the mounter 100 includes a mechanical part 131 and a mounting condition determination apparatus 200.

The mechanical part 131 shows a general mechanism for performing a concrete mounting processing, and includes the mounting head 112, the XY robot 113, the component supply unit 115, the rail 121 for transporting the board 120, and the like.

The mounting condition determination apparatus 200 is a computer apparatus which calculates the most suitable mounting conditions based on operational state parameters which indicate the operational state of the mounter 100, and includes an operational state obtainment unit 201, a mounting condition determination unit 202, a data storage unit 203, a display unit 204, an input unit 205, and a mechanism control unit 206. In the embodiment, the mounting condition determination apparatus 200 is incorporated into the mounter 100.

The operation state obtainment unit 201 is a processing unit capable of obtaining the operational state parameter during the mounting of the electronic component A.

The operation state parameters may be the amount of misalignment between the suction nozzle 111 and the electronic component A, measured by the recognition apparatus 124, and the number of the electronic components A which could not be held by the suction nozzle 111 or which are collected by the component collecting apparatus 123, or the like.

The operational state obtainment unit 201 can obtain, as the operational state parameter, a value indicating the mounting misalignment of the electronic component A obtained by an inspection equipment incorporated into the mounter or an inspection equipment provided as a separate device, the number of the electronic components A which turned out to be defective in the mounting process, the amount of misalignment in the supply of the tape feeder 114 which composes the component supply unit 115, that is, the amount of misalignment between the electronic component A to be supplied and the suction position.

The mounting condition determination unit 202 is a processing unit which determines a condition for the mounter 100 to mount the electronic component A onto the board 120, and particularly determines the mounting conditions by adjusting the operational state parameters obtained by the operational state obtainment unit 201.

To be concrete, the mounting condition determination unit 202 is a processing unit which adjusts the mounting condition so that a value of the parameter falls within the predetermined range, in the case where a value of the operational state parameter obtained by the operational state obtainment unit 201 is greater (this corresponds to the expression "better" used in the claims) than the predetermined range, and determines the mounting condition so that the throughput of the mounter 100 improves. On the other hand, in the case where a value of the parameter is smaller than the predetermine range, the operational state obtainment unit 201 determines the mounting condition which decrease the throughput of the mounter 100 so that a value of the parameter falls within the predetermined range.

The parameters to be adjusted by the mounting condition determination unit 202 in order to determine the condition may be the positive or negative acceleration and the rest time after the operation stops, as generated in each of the processes <1> through <5>. More precisely, they are positive or negative acceleration (V1 and V3 in FIG. 6) generated when the multi-headed part 110 moves and stops within the horizontal place, and the rest time (D1 to D3 in FIG. 6) after the multi-headed part 110 or the suction nozzle 111 stops within the horizontal plane, the speed at which the component supply unit 115 supplies the electronic component A, and the rest time after the supply of the electronic component A.

Note that it is preferable to determine the most suitable mounting conditions. However, the mounting conditions may not be the most suitable but such that can obtain improvement such as a mounting time is shortened.

The data storage unit 203 is a storage apparatus such as a hard disk into which the information for determining each of the parameters through adjustment is stored. Such data storage unit 203 stores process data and feeder data. In the process data, a reference acceleration, a speed pattern and a reference rest time after a predetermined position is reached, in each process (FIG. 5: <1> through <5>, the top dead center of the suction nozzle 111, moving between the bottom dead centers), are associated with each other, as shown in FIG. 8. In the feeder data, a reference speed and a rest time generated in the supply of the electronic component A by the tape feeder 114 of the supply unit 115 are associated with each tape feeder 114, as shown in FIG. 9.

The information relating to acceleration included in the process data is defined by associating the acceleration determined in terms of level (e.g. level 1 through level 9), and the lower the level becomes, the higher the acceleration is.

Figure 10:
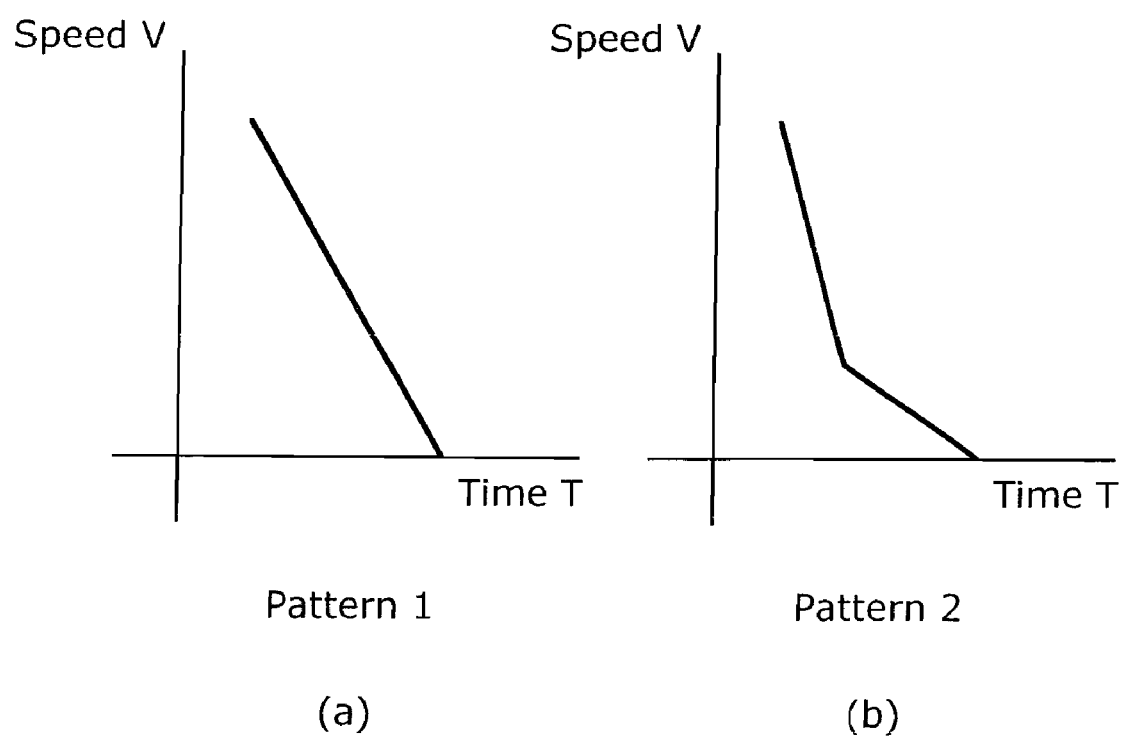
FIG. 10 shows an example of a speed pattern.

The speed pattern is information for determining which of the speed patterns should be used for moving the multi-headed part 110. The examples of the speed patterns are as follows: a constant acceleration, as shown in FIG. 10A; and a steep acceleration for at the initial period but decrease the acceleration as the destination is approached, as shown in FIG. 10B. In the information, a number and a speed pattern are associated with each other.

The display unit 204 may be a CRT or an LCD while the input unit may be a keyboard, a mouse and a touch panel. These units are used for inputting control data for controlling the mounter 100 while during the dialog between the mounter 100 and the operator.

The mechanism control unit 206 is a processing unit which controls the mechanic section 131 based on the determined mounting conditions.

Next, an outline of the operation of the mounting condition determination apparatus 200 having the configuration as described above follows.

Figure 11:
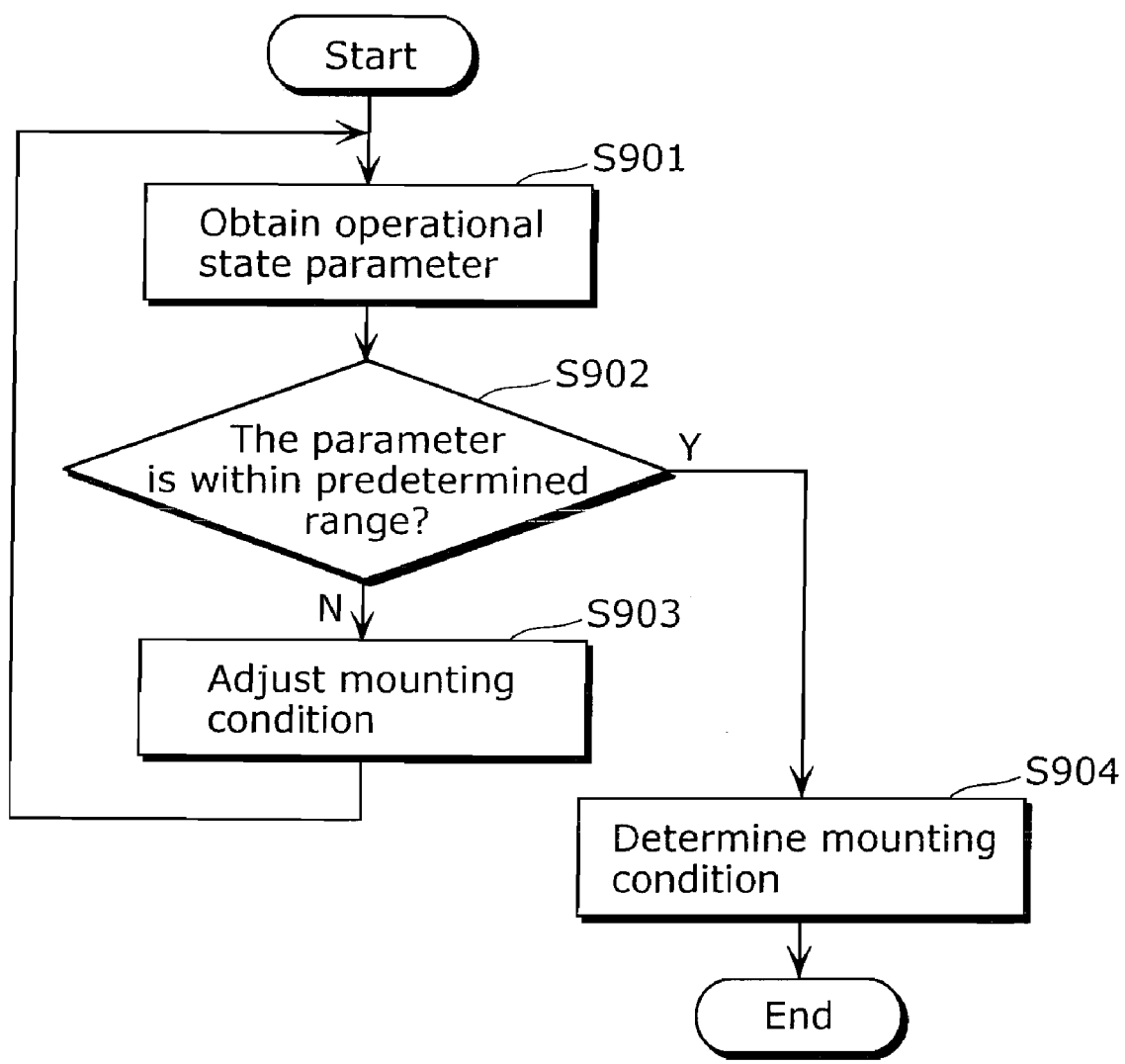
FIG. 11 is a flowchart showing an example of the operation of the mounting condition determination apparatus according to the embodiment.

FIG. 11 is a flowchart showing the operation of the mounting condition determination apparatus 200 of the embodiment.

First, the operational state obtainment unit 201 obtains a operational state parameter which is provided by a device other than the mounter 100, or the operational state parameters which have been measured by the mounter 100 in the past (S901).

Next, the mounting condition determination unit 203 judges whether or not a value of the obtained operational state parameter is within a predetermined range which is preset. (S902). In the case where a value of the parameter is within the predetermined range (Y in S902), the present mounting condition is determined as a mounting condition (S904).

In the case where the value the parameter is not within the predetermined range (N in S902), the mounting condition is adjusted by changing the present mounting condition (S903). The mounting processing is performed based on the adjusted mounting condition, and the processing is repeated again from the process (S901) of obtaining an operational state parameter.

The following describes an example of the detailed processing of the mounting condition determination apparatus 200.

Figure 12:
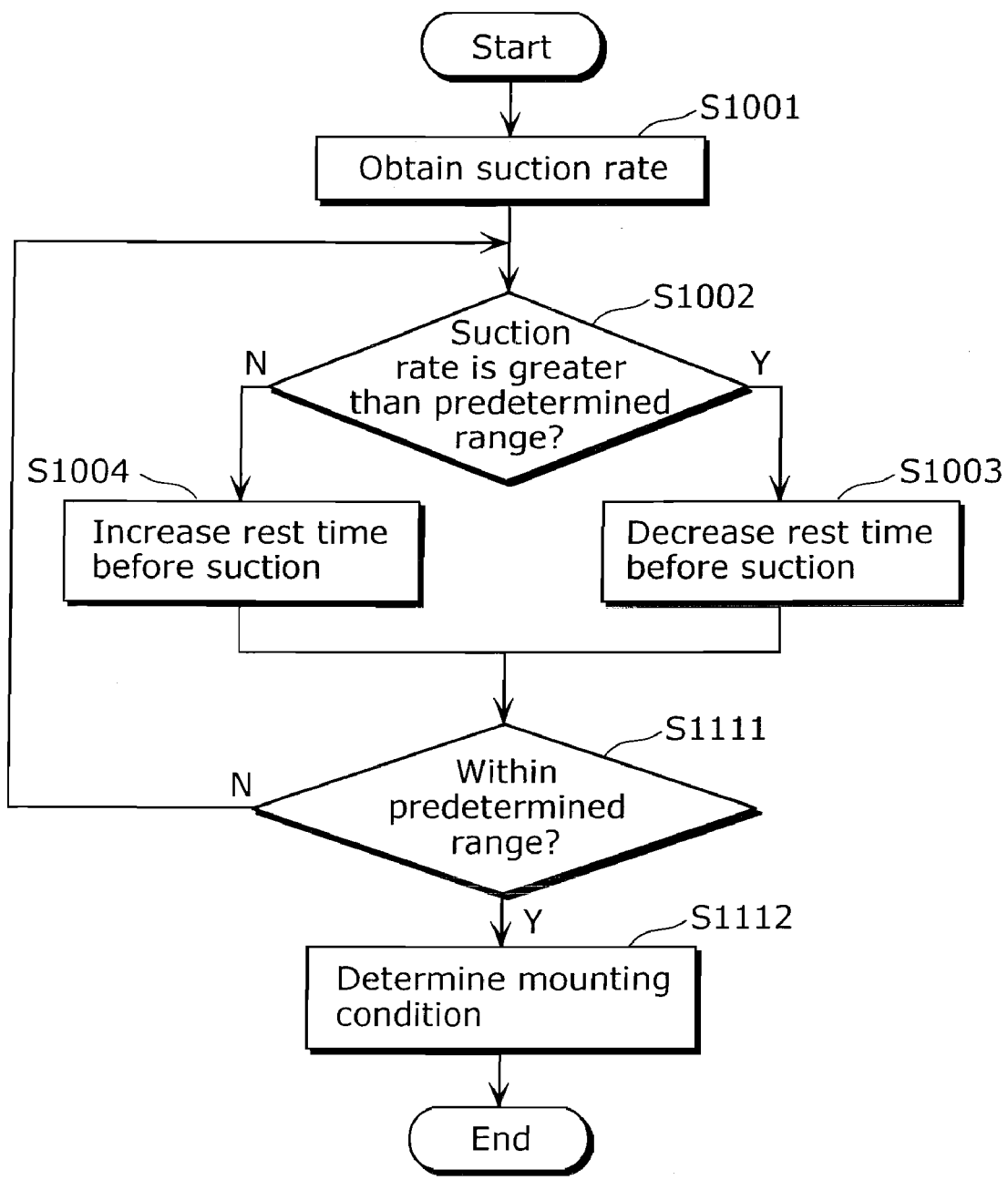
FIG. 12 is a flowchart showing an example of another detailed operation of the mounting condition determination apparatus.

FIG. 12 is a flowchart showing, as an example, another detailed operation of the mounting condition determination apparatus 200.

As shown in the diagram, the operation is a processing of obtaining a suction rate from among the mounting accuracies as the operational state parameters, and determining a mounting condition based on the obtained parameter.

First, the operational state obtainment unit 201 obtains a suction rate provided from a device other than the mounter 100 or the suction rates which have been measured by the mounter 100 in the past (S1001).

The suction rate to be obtained in this step is a value derived by dividing the number of the components which could not be sucked by the number of the components to be sucked, through the statistic operation executed by the operational state obtainment unit 201. The number of the components which could not be sucked can be obtained by recognizing the state of suction via the recognition apparatus 124 and counting the number of the components which could not be properly sucked, or by detecting that a suction pressure is not normal via vacuuming pressure sensor equipped to a suction nozzle and counting the number of the components whose suction pressure is found to be not normal.

Then, in the case where a value of the suction rate among the obtained mounting accuracies is smaller than a predetermined range (Y in S1002), the mounting condition determination unit 203 temporarily determines a mounting condition so that the suction rate is adjusted to be more severe for the enhancement of the throughput. In the case where the value of the suction rate is greater than the predetermined range (N in S1002), the mounting condition determination unit 203 temporarily determines a mounting condition so that the suction rate is adjusted to be less severe.

As a concrete example of the adjustment of the mounting condition in a severe direction, the rest time during which the suction nozzle 111, in the component supply unit 115, stops after the suction nozzle 111 descends and comes into contact with the electronic component A in order to suck and hold the electronic component A is decreased, and then, the rest time during which the tape feeder 114 stops after having supplied the electronic component A until the suction nozzle 111 gets into contact with the electronic component A is decreased (S1003).

In the case where a value of the suction rate is smaller than the predetermined range (N in S1002), the rest time is increased (S1004).

Note that the examples of the method of adjusting time may be as follows: sequentially adding or subtracting the rest time indicated in the process data by 10%; and adding or subtracting 3 msec to the rest time.

In the case where a value of the suction rate is within the predetermined range (Y in S1111), the mounting condition determination unit 203 determines the present suction rate as a mounting condition (S1112). In the case where a value of the suction rate is not within the predetermined range (N in S1111), the mounting condition determination unit 203 adjusts the mounting condition again.

The following describes the processing of obtaining a mounting rate and determining a mounting condition based on the obtained mounting rate.

Figure 13:
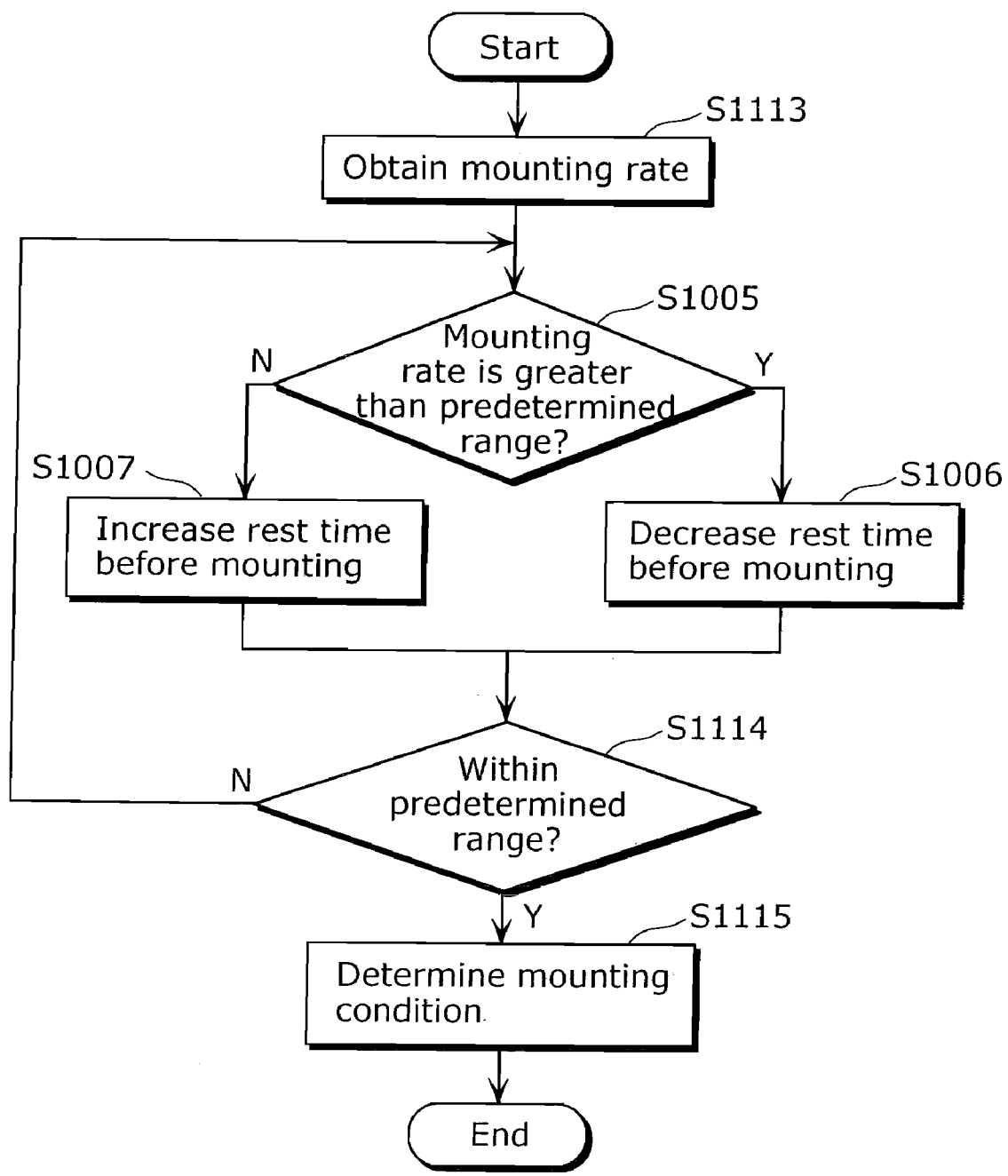
FIG. 13 is a flowchart showing an example of yet another detailed operation of the mounting condition determination apparatus.

FIG. 13 is a flowchart showing yet another example of the detailed operation of the mounting condition determination apparatus 200.

The mounting condition determination unit 203 obtains a mounting rate (S1113). In the case where the mounting rate is better than a predetermined range (Y in S1005), the mounting condition determination unit 203 decreases the rest time during which the multi-headed part 110 stops after moving to the position above the board 120, or the time during which the suction nozzle 111 stops after having descended in order to mount the sucked and held electronic component A onto the board 120 and the electronic component A comes into contact with the board 120 (S1006). The mounting condition determination unit 203 then temporarily determines a mounting condition based on the decreased rest time. In the case where the mounting rate is worse than the predetermined range (N in S1005), the rest time is increased (S1007) and the mounting condition determination unit 203 determines a mounting condition based on the increased rest time.

In the case where the mounting rate is within the predetermined range (Y in S1114), the mounting condition determination unit 203 determines the present mounting rate as a mounting condition (S1115). In the case where the mounting rate is not within the predetermined range (N in S1114), the mounting condition determination unit 203 adjusts the mounting condition again.

The following describes the processing of obtaining, as the operational state parameter, the amount of misalignment between the suction nozzle 111 and the electronic component A, and determining a mounting condition based on the obtained parameter.

Figure 14:
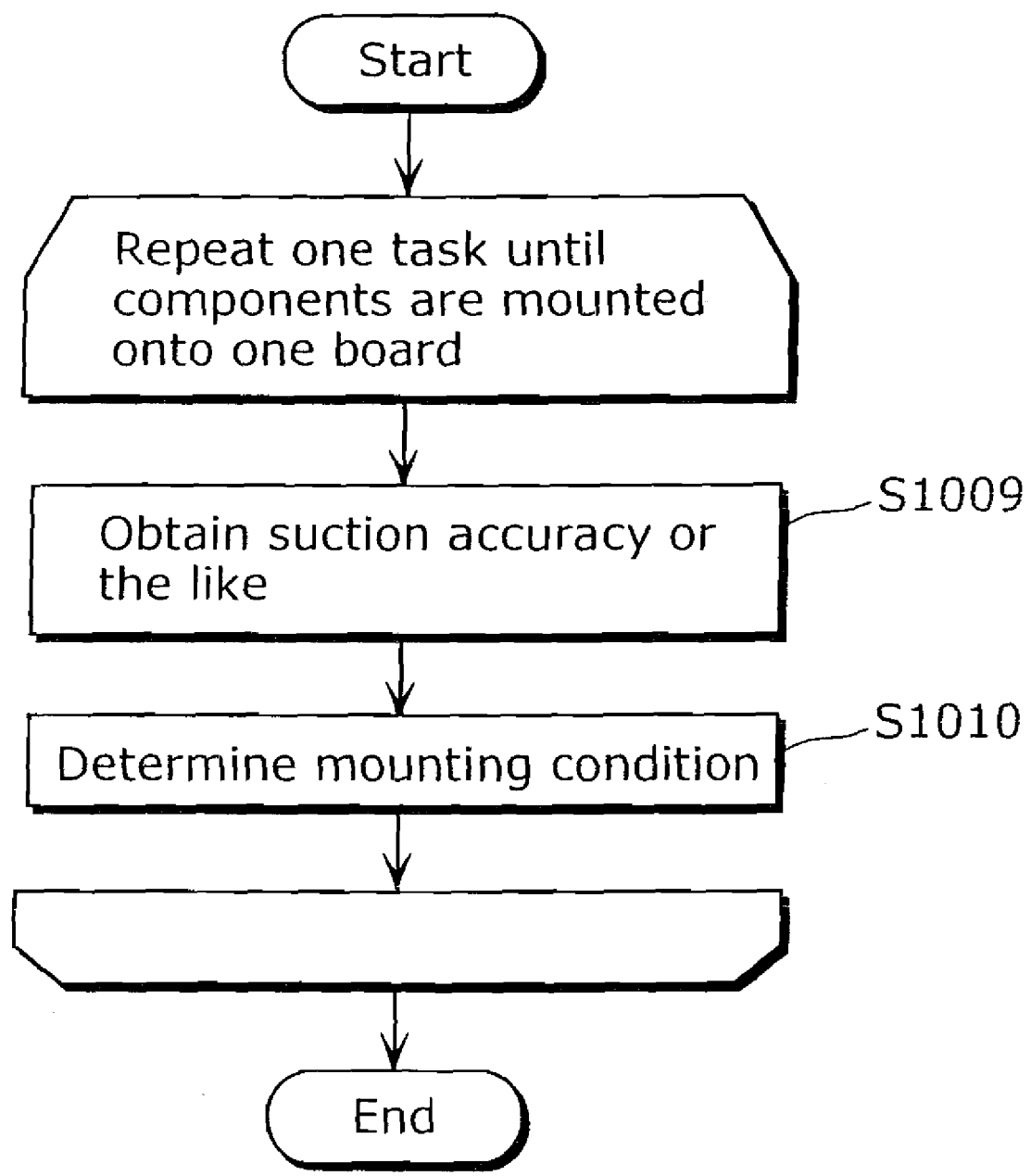
FIG. 14 is a flowchart showing an example of still another detailed operation of the mounting condition determination apparatus.

FIG. 14 is a flowchart showing a still another example of the detailed operation of the mounting condition determination apparatus 200.

The operational state obtaining unit 201 obtains, as the operational state parameter, the amount of misalignment (suction accuracy) between the suction nozzle 111 and the electronic component A, from the recognition apparatus 124 (S1009), adjusts the time during which the suction nozzle 111 stops after having descended and contacted the electronic component A, in the component supply unit 115, in order to suck and hold the electronic component A, and determines a mounting condition based on the adjusted time (S1010).

The process described above is performed for each task and the mounting condition is determined for the following task based on the operational state parameter obtained for the immediately preceding task.

Here, a task is equivalent to an iteration of repeating a series of operations, performed by the multi-headed part 110, of sucking, moving and mounting of components. One task corresponds to the procedure <1> through <5> shown in FIG. 5.

The electronic component A is recognized by the recognition apparatus 124 in each task (<3> and <4> in FIG. 5), and it is possible to obtain, as the operational state parameter, the amount of misalignment between the suction nozzle 111 and the electronic component A, in each task.

With the processing as described above, the mounting condition determination apparatus 200 can obtain the operational state parameters unique to the mounter 100, and determine the most suitable mounting conditions for an individual mounter by adjusting each of the mounting conditions depending on each of the operational state parameters. In the particular case where a value of a operational state parameter is greater than a predetermined range, it is possible to make use of it for the enhancement of the throughput of the mounter 100.

Moreover, even in the case where the mounter changes during the day or over the years, it is possible to create the most suitable mounting conditions as the circumstance demands, and flexibly adapt to the change.

For example, in the case where the air leaks more or less due to wearing of the head of the suction nozzle 111 caused by deterioration with age, this results in the decrease of a suction rate or a mounting rate. That is to say that the mounting condition determination apparatus 200 can detect (monitor) a deterioration with age, a temperature change, and a variation among the mounters 100 based on a suction rate, a mounting rate and a mounting alignment, and determine the mounting conditions that can adapt to the deterioration with age.

Note that, according to the description above, each type of the operational state parameters is obtained in an arbitrary timing, however, the present invention is not limited to this. Plural operational state parameters may be obtained at once for each manufacturing of a board. Also, the timing of determining a mounting condition based on an obtained operational state parameter as well as the parameter to be adjusted may be arbitrarily set.

The acceleration of the multi-headed part within the horizontal plane, the rest time after the multi-headed part stops the movement, the rest time at the upper and lower end of the stroke of the suction nozzle 111 and the speed of supplying an electronic component are taken as the examples of the conditions to be adjusted for the determination of the mounting conditions. The present invention, however, is not restricted to this, and the mounting conditions may be an acceleration at which the whole component supply unit moves and the rest time after the movement, in a rotary mounter, for instance.

The mounter equipped with the mounting condition determination apparatus is shown as the example of the present invention, however, the mounting condition determination apparatus and the mounter may operate as separate devices.

The operational state parameter may be the misalignment amount of the supply position previously measured using an inspection tool with respect to the tape feeder 114 equipped in the mounter 100, the amount of mounting misalignment between the board 120 and the electronic component A, measured by another inspection equipment with respect to a mounter which is already manufactured in the series of the processes described above, the amount of suction misalignment between the electronic component A and the suction nozzle 111, already measured by the recognition apparatus 124, the number of the components which turned out to be defective in the suction process, or the number of the components to be sucked. Moreover, the operational state parameters include the following parameters calculated through the statistics operation executed by the operational state obtainment unit 201: a supply accuracy based on the misalignment amount of the supply position; a mounting accuracy based on the amount of mounting misalignment; a suction accuracy based on the amount of suction misalignment, a suction rate derived by dividing the number of the components which could not be sucked by the number of the components to be sucked.

In addition, the operational state parameters include the following parameters: a recognition error rate which is a probability at which an electronic component cannot be recognized by the recognition apparatus 124, a component returning back rate which is a probability at which an electronic component is returned back since the electronic component does not detach from the suction nozzle 111 for a certain reason during the operation of mounting the electronic component onto the board 120, a defect rate which is a probability at which an electronic component is not mounted on the board 120 for a certain reason are also the operational state parameters.

The adjustment of the mounting conditions in the determination of the mounting conditions is performed with priority given to the mounting condition that is closely related to an obtained operational state parameter.

The examples of the mounting condition corresponding to the suction accuracy may be a rest time during which the suction nozzle stops at the bottom dead center, a speed at which the tape feeder 114 supplies an electronic component A, a timing at which the suction nozzle 111 supplies an electronic component A and comes into contact with the electronic component A, an acceleration of the multi-headed part 110 within the horizontal plane, and a rest time after the multi-headed part 110 stops the movement.

The example of the mounting condition corresponding to the recognition error rate may be an intensity of illumination for illuminating the electronic component A when recognizing the electronic component A with the recognition apparatus 124. The example of the mounting condition corresponding to the component returning back rate and the defect rate may be the suction pressure (vacuuming pressure) for sucking the electronic component A by the suction nozzle 111, a caliber of the open nozzle, of the suction nozzle 111, which comes into contact with the electronic component A.

The example of the method of adjusting a mounting condition may be rendering the intensity of luminance to be brighter by one level when the recognition error rate is higher than the predetermined range, rendering the caliber of the suction nozzle 111 to be larger by one size, or heightening the suction pressure when the component returning back rate or the defect rate is higher than the predetermined range.

Also, the examples of the mounting condition corresponding to the mounting accuracy may be the time during which the multi-headed part 110 stops after having moved within the horizontal plane, the acceleration of the multi-headed part 110, and the rest time of the suction nozzle 111 at the bottom dead center.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

The present invention is useful as a mounter, especially as a mounter or the like, which mounts electronic components onto a print board.

The invention claimed is:

1. A mounting condition determination method for determining a mounting condition of a mounter which mounts a component onto a board, said method comprising:

obtaining an operation state parameter indicating an operational state of the mounter, which varies depending on a variation including a variation in dimensional accuracy of a component making up the mounter; and determining a mounting condition including a rest time during which a mounting head equipped in the mounter stops after having moved, by reducing the rest time when the obtained parameter is better than a predetermined range in which stable mounting can be performed, and by extending the rest time when the obtained parameter is worse than the predetermined range, wherein when the rest time is reduced a throughput increases to a value more than a predetermined value, and when the rest time is extended the throughput decreases to a value less than the predetermined value.

2. A mounting condition determination method for determining a mounting condition of a mounter which mounts a component onto a board, said method comprising:

obtaining an operational state parameter indicating an operational state of the mounter, which varies depending on a variation including a variation in dimensional accuracy of a component making up the mounter; and determining a mounting condition including a rest time during which a suction nozzle equipped in the mounter stops after having descended, by reducing the rest time when the obtained parameter is better than a predetermined range in which stable mounting can be performed, and by extending the rest time when the obtained parameter is worse than the predetermined range, wherein when the rest time is reduced a throughput increases to a value more than a predetermined value, and when the rest time is extended the throughput decreases to a value less than the predetermined value.

* * * * *